(12) United States Patent
Confalonieri et al.

(10) Patent No.: US 8,572,333 B2
(45) Date of Patent: Oct. 29, 2013

(54) NON-VOLATILE MEMORY WITH EXTENDED OPERATING TEMPERATURE RANGE

(75) Inventors: Emanuele Confalonieri, Milan (IT); Daniele Vimercati, Besana in Brianza (IT)

(73) Assignee: Micron Technology, Inc., Boise, ID (US)

( * ) Notice: Subject to any disclaimer, the term of this patent is extended or adjusted under 35 U.S.C. 154(b) by 98 days.

(21) Appl. No.: 12/532,828

(22) PCT Filed: Dec. 30, 2008

(86) PCT No.: PCT/IT2008/000816
§ 371 (c)(1),
(2), (4) Date: Apr. 26, 2011

(87) PCT Pub. No.: WO2010/076828
PCT Pub. Date: Jul. 8, 2010

(65) Prior Publication Data
US 2011/0302353 A1    Dec. 8, 2011

(51) Int. Cl.
G06F 13/00    (2006.01)
(52) U.S. Cl.
USPC ................... 711/154; 711/103; 711/E12.079
(58) Field of Classification Search
USPC ......................................... 711/103, 105, 106
See application file for complete search history.

(56) References Cited

U.S. PATENT DOCUMENTS

| | | | |
|---|---|---|---|
| 2001/0014049 A1* | 8/2001 | Woo et al. .................. | 365/211 |
| 2002/0021599 A1* | 2/2002 | Peter ............................ | 365/200 |
| 2003/0046487 A1* | 3/2003 | Swaminathan ............... | 711/106 |
| 2004/0128433 A1* | 7/2004 | Bains .............................. | 711/106 |
| 2005/0005082 A1* | 1/2005 | Au et al. ........................ | 711/170 |
| 2005/0235102 A1* | 10/2005 | Sakurai .......................... | 711/106 |
| 2007/0280023 A1* | 12/2007 | Happ et al. .................... | 365/222 |
| 2008/0046664 A1* | 2/2008 | Hataida et al. ................ | 711/146 |
| 2008/0084738 A1* | 4/2008 | Philipp et al. ............ | 365/185.03 |
| 2009/0198879 A1* | 8/2009 | Tanaka .......................... | 711/103 |
| 2011/0219203 A1* | 9/2011 | Nurminen et al. ............ | 711/165 |
| 2012/0033519 A1* | 2/2012 | Confalonieri et al. ........ | 365/222 |

FOREIGN PATENT DOCUMENTS

| | | |
|---|---|---|
| CN | 101133457 A | 2/2008 |
| CN | 101133459 A | 2/2008 |
| CN | 101145391 A | 3/2008 |
| CN | 101159164 A | 4/2008 |
| CN | 101221464 A | 7/2008 |
| DE | 100 40 890 C1 | 1/2002 |
| DE | 112008000968 T5 | 1/2012 |
| EP | 1 858 021 A2 | 11/2007 |
| WO | WO-2008093606 A1 | 8/2008 |
| WO | WO-2010076828 A1 | 7/2010 |

OTHER PUBLICATIONS

PCT International Search Report and Written Opinion for PCT/IT2008/000816, mailed Nov. 3, 2009, 12 pages.
PCT Invitation to Pay Additional Fees for PCT/IT2008/000816 containing communication Relating to the Results of the Partial International Search, mailed Sep. 11, 2009, 4 pages.
"Chinese Application Serial No. 200880006540.3, Office Action mailed Nov. 19, 2012", 18 pgs.

* cited by examiner

*Primary Examiner* — Edward Dudek, Jr.
*Assistant Examiner* — Sean D Rossiter
(74) *Attorney, Agent, or Firm* — Schwegman Lundberg & Woessner, P.A.

(57) ABSTRACT

A method and apparatus are described for measuring a temperature within a non-volatile memory and refreshing at least a portion of the non-volatile memory when the temperature exceeds a threshold temperature for an amount of time.

22 Claims, 9 Drawing Sheets

| RR Bit | Meaning | Value |
|---|---|---|
| RR.0 | Trigger Event | 0 On<br>1 Off |
| RR.1 | Page Refresh Active | 0 Yes<br>1 No |
| RR.2 | Locations Under Refresh | A5 |
| RR.3 | | A6 |
| ... | | ... |
| RR.15 | | A18 |

FIG. 9

NON-VOLATILE MEMORY WITH EXTENDED OPERATING TEMPERATURE RANGE

CROSS REFERENCE TO RELATED APPLICATION

This patent application is a U.S. National Phase application under 35 U.S.C. §371 of International Application No. PCT/IT2008/000816, filed on Dec. 30, 2008, entitled NON-VOLATILE MEMORY WITH EXTENDED OPERATING TEMPERATURE RANGE.

FIELD

Embodiments of the present invention relate generally to the field of application-specific electronic devices, such as computers and telecommunications equipment. More particularly, these embodiments relate to products, systems, and methods for extending the operating temperature range of a non-volatile memory.

BACKGROUND

Non-volatile memories ("NVM") are used in numerous electronic devices, including computers, video game consoles, telecommunications devices, etc. Operating temperatures have an impact on the quality and reliability of an NVM. For example, the operating temperature for a NVM may be limited to the range of −25 to 85° C. and the quality and reliability characteristics of a NVM may be defined based upon operating at 85° C. for 10 years.

Devices that utilize NVM, e.g., cellular phones, have increased their demand for performance by including features such as global positioning and mapping, streaming video, video games, etc. In order to support these features, vendors are increasing the device's "instructions per second" performance and clock frequencies. Consequently, the internal temperature of the devices is also increasing, causing a corresponding increase in memory junction temperature. Furthermore, packaging solutions like the Package-On-Package ("POP"), Multi-Chip-Package ("MCP"), and True-Silicon-Via ("TSV") increase thermal coupling. Furthermore, phase change memory ("PCM") technology is thermally driven and, therefore, more sensitive to temperature changes.

BRIEF DESCRIPTION OF THE DRAWINGS

Embodiments of the present invention are illustrated by way of example and not limitation in the figures of the accompanying drawings, in which like references indicate similar elements, and in which:

FIG. 9 is a table showing exemplary values for a refresh register used to synchronize the non-volatile memory refresh with a memory controller according to an embodiment of the invention.

DETAILED DESCRIPTION

A method and apparatus are described for measuring a temperature within a non-volatile memory ("NVM") and refreshing at least a portion of the NVM when the temperature exceeds a threshold temperature for a period of time. Refreshing the NVM ensures stability of the data stored within the NVM when operating at high temperatures. Embodiments of the invention extend the operating temperature range of NVM technologies to be compliant with the temperature-intense demands of DRAM specifications, increasing demands from applications, and wireless system requirements. For one embodiment, a refresh operation comprises a verify or read operation followed by programming pulses or a write operation.

Unless specifically stated otherwise, as apparent from the following discussions, it is appreciated that throughout the specification discussions utilizing terms such as "processing," "computing," "calculating," "determining," or the like, refer to the action or processes of a computer, computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Figure 1:
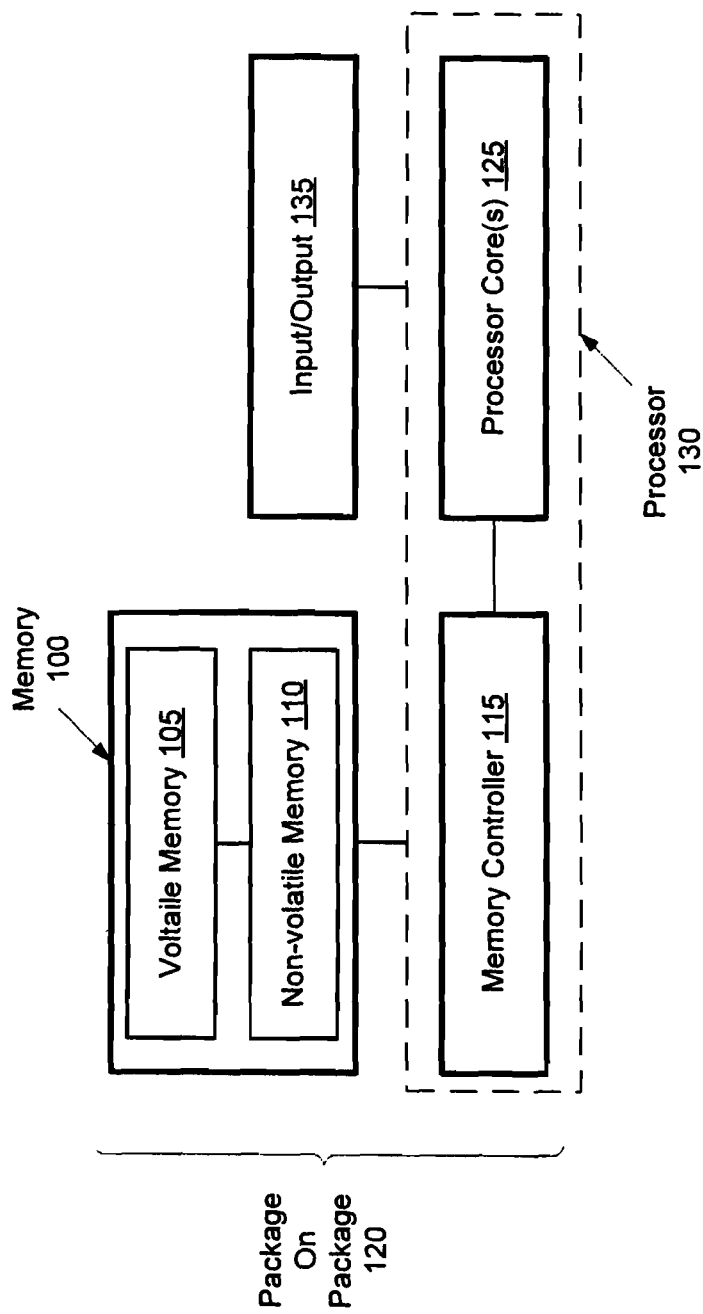
FIG. 1 is a block diagram of an exemplary device in which an embodiment of the invention is implemented.

FIG. 1 is a block diagram of an exemplary device in which an embodiment of the invention is implemented. The memory 100 may include one or more different types of memory. For one embodiment, the memory 100 includes a volatile memory 105 and a NVM 110. For an alternate embodiment, the memory 100 only includes a NVM 110.

For one embodiment, the NVM 110 is a Phase Change Memory ("PCM"), which may also be referred to as a Phase-Change Random Access Memory ("PRAM" or "PCRAM"), Ovonic Unified Memory ("OUM"), or Chalcogenide Random Access Memory ("C-RAM"). For an alternate embodiment, the NVM 110 is a magnetoresistive random access memory ("MRAM"), ferroelectric random access memory (FRAM), flash memory, erasable programmable read-only memory ("EPROM"), electrically erasable programmable read-only memory ("EEPROM"), or other known non-volatile memory.

The volatile memory 105 and NVM 110 may be combined in a stacking process to reduce the footprint on a board, packaged separately, or placed in a multi-chip package with the memory component 100 placed on top of a memory controller 115 or one or more processor cores 125. For one embodiment, the memory 100 is combined with the memory controller 115 using a package-on-package 120 stacking technique.

The memory controller 115 manages the primary functions concerning the memory 100, including read requests, write requests, and memory refresh. For one embodiment, the memory controller 115 and the processor core(s) 125 are a part of the same package (the processor 130) or the memory controller 115 is integrated within a processor core 125. For an alternate embodiment, the memory controller 115 and the processor core(s) 125 are packaged separately. For another embodiment, one or more of the processor cores 125 are embedded with NVM 110 (not shown). For yet another embodiment, the processor 130 includes a memory controller 115 without one or more processor cores 125.

For one embodiment, the processor core(s) 125 are connected to an input/output module 135. The input/output module 135 is responsible for transferring data to and/or from the device. For one embodiment, the input/output module 135 includes a wireless transceiver such as a radio frequency ("RF") transceiver for a mobile communications device. As such, the device may operate as a cellular device or a device that operates in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks, although the present invention is not limited to operate in only these networks. For one embodiment, the input/output module 135 provides a wired connection, e.g., to communicate with another device, an external or removable memory, etc.

For one embodiment, memory 100 stores instructions that are executed by the memory controller 115 (or processor 130) during the operation of device. For one embodiment, the memory 100 stores user data, such as the conditions for when a message is to be transmitted or the actual data to be transmitted. For example, the instructions stored in the memory 100 perform wireless communications, provide security functionality for the device, user functionality such as calendaring, email, internet browsing, etc.

Figure 2:
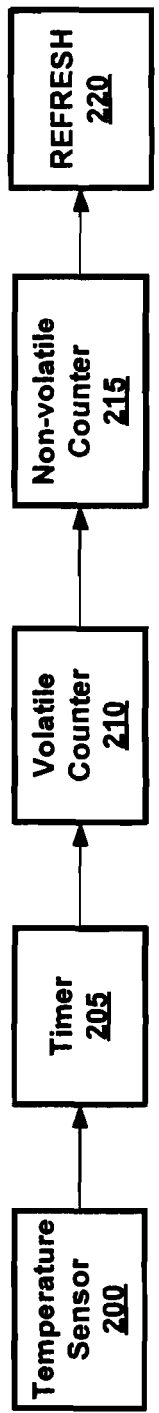
FIG. 2 is a high-level block diagram including modules to initiate the refresh of a non-volatile memory according to an embodiment of the invention.

FIG. 2 is a high-level block diagram including modules to initiate the refresh of the NVM 110 according to one embodiment of the invention. The temperature sensor 200 measures the junction temperature within the NVM 110 (e.g., the silicon temperature of the memory). The instantaneous temperature affects electrical parameters such as the stand-by current, the saturation current of CMOS devices, etc. The junction temperature over time has an impact on the memory cells retention.

For one embodiment, at least a portion of the NVM 110 is refreshed when the temperature of the NVM 110 exceeds a threshold temperature for a period of time. For one embodiment, the threshold temperature or the period of time is set at the time the memory controller 115 is manufactured. For one embodiment, the threshold temperature or the period of time is programmable and can be set by either a manufacturer, an intermediary, or by an end-user.

For one embodiment, the temperature sensor 200 is implemented within the NVM 110. If the temperature of the NVM 110 exceeds a threshold temperature, the timer 205 begins tracking the amount of time spent above the threshold temperature. For one embodiment, the timer 205 utilizes a system clock. For an alternative embodiment, the timer 205 utilizes a clock separate from the system clock, a phase-locked loop, or other known reference signal.

The amount of time the temperature exceeds the threshold temperature is tracked in two levels of granularity. For example, the first and second levels of granularity could track, respectively, the amount of time in minutes and tens of minutes, minutes and hours, hours and days, days and weeks, etc. For one embodiment, the first level of granularity is tracked within a volatile counter 210, which is stored in the volatile memory 105 and the second level of granularity is tracked within a non-volatile counter 215, which is stored in the NVM 110. If an event that would cause the loss of information in the volatile memory 105, e.g., a power loss, shut down, etc., the less significant level of granularity stored in the volatile counter 210 would be lost, but the more significant level of granularity remains stored in the non-volatile counter 215.

The volatile counter 210 is incremented each time the timer 205 reaches an additional unit of the first level of granularity. The timer 205 stops when the temperature sensor 200 determines that the instantaneous junction temperature of the NVM 110 has fallen below the threshold temperature. Nevertheless, the counters maintain an ongoing count and the timer 205 will restart anytime the instantaneous junction temperature of the NVM 110 rises above the threshold temperature again.

The non-volatile counter 215 is incremented each time the volatile counter 210 reaches a unit of the second level of granularity. Finally, a refresh 220 of at least a portion of the NVM 110 is triggered when the non-volatile counter 215 reaches the threshold period of time. For one embodiment, the refresh 220 is a trigger signal sent to the memory controller 115, which in turn performs the refresh of the NVM 110. For an alternate embodiment, the refresh 220 causes the setting of a register value, stored within the NVM 110. The memory controller 115 periodically monitors the register value and performs the refresh of the NVM 110 if the register value is set to trigger a refresh (discussed further below).

Additionally, the instantaneous junction temperature can be used to set a register value accessible by the software or by the memory controller 115 to inform the system about the high temperature level of the memory. The system is then in the position to de-rate some critical timings in response to operating at a high temperature.

Figure 3:
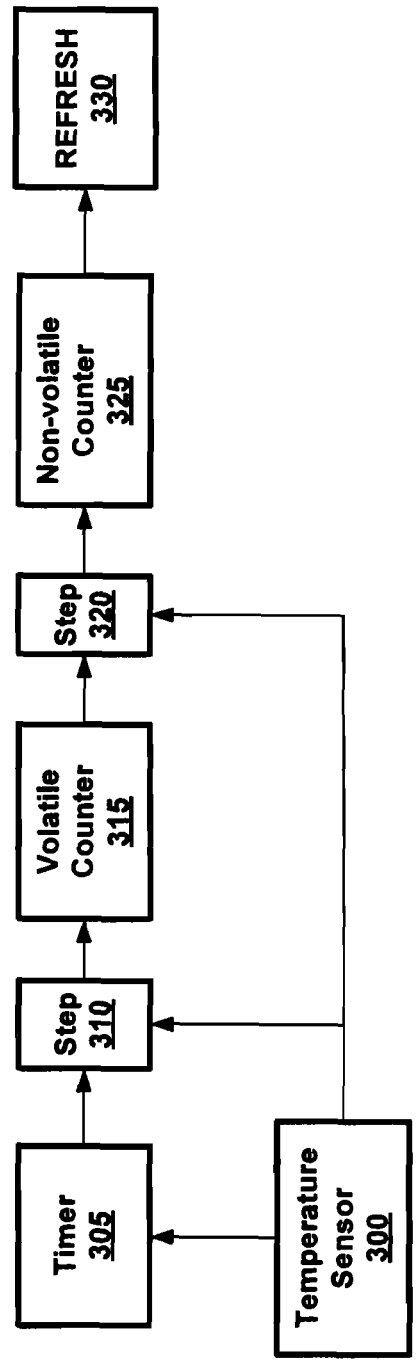
FIG. 3 is a high-level block diagram including modules to initiate the refresh of a non-volatile memory according to an alternate embodiment of the invention.

FIG. 3 is a high-level block diagram including modules to initiate the refresh of the NVM 110 according to an alternate embodiment of the invention. Similar to the embodiment shown in FIG. 2, a temperature sensor 300 triggers a timer 305 and the amount of time the NVM 110 spends above a threshold temperature is tracked in two levels of granularity in a volatile counter 315 and non-volatile counter 325. If a threshold amount of time is reached, a refresh 330 is triggered. However, for this alternative embodiment, step modules 310 and 320 are added. The step modules 310 and 320 are used to increase the frequency of refresh operations as the temperature reaches higher (or more critical) levels.

The step modules 310 and 320 provide a weighting effect on one or both of the counters 315 and 325. As a result, a plurality of threshold temperatures can be set. At each increased level of operating temperature, one or both of the step modules 310 and 320 act as multipliers for the count or otherwise increase the count of the timer 305 as it triggers the count of the volatile counter 315 or the count of the volatile counter 315 as it triggers the count of the non-volatile counter 325. Alternatively, one or both of the step modules 310 and 320 acts to control the trigger levels for counters 315 and 325 respectively. As the increased levels of operating temperature are reached, the threshold levels for the first and second levels of granularity are be decreased.

Figure 4:
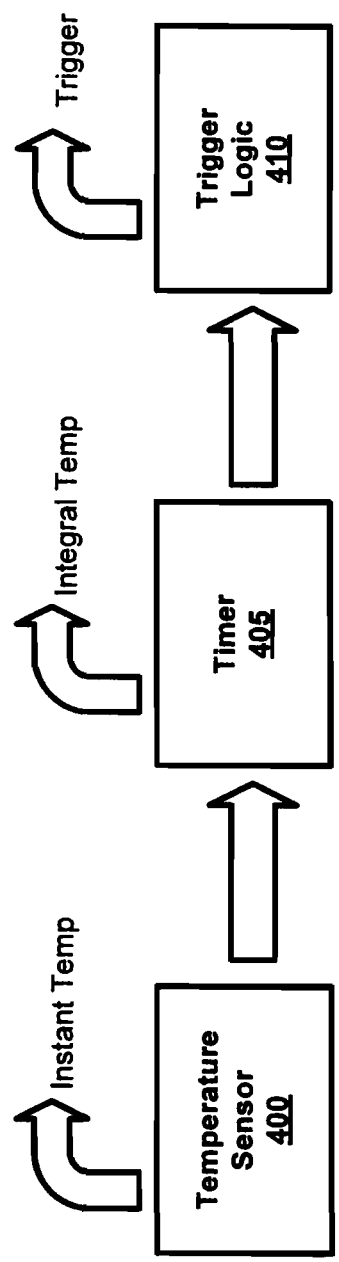
FIG. 4 is a high-level block diagram including modules to initiate the refresh of a non-volatile memory according to another alternate embodiment of the invention.

FIG. 4 is a high-level block diagram including modules to initiate the refresh of the NVM 110 according to another alternate embodiment of the invention. Similar to the embodiment shown in FIGS. 2 and 3, a temperature sensor 400 measures the junction temperature within the NVM 110. If the temperature of the NVM 110 exceeds a threshold temperature, the timer 405 begins tracking the time spent above the threshold temperature. If the temperature falls below the threshold temperature, the timer 405 stops tracking the time. The trigger logic 410 calculates the integral of the junction temperature by cumulatively combining the instant temperature measured by the temperature sensor 400 with the associated time or count as measured by the timer 405. If the integral of the junction temperature exceeds an integral threshold, the trigger logic 410 triggers a refresh of at least a portion of the NVM 110. Accordingly, both the time spent at a temperature above the threshold temperature and the amount of temperature above the threshold temperature serve as factors in the frequency of a refresh of the NVM 110.

For one embodiment, if the integral of the junction temperature does not exceed an integral threshold, the integral value is stored within the NVM 110. The next time the temperature of the NVM 110 exceeds a threshold temperature, the previous integral temperature is summed with the current integral to determine when to trigger a refresh of the NVM 110.

For one embodiment, the temperature sensor 400, timer 405, and trigger logic 410 are implemented within the NVM 110. Alternatively, one or both of the timer 405 and the trigger logic 410 is implemented within the memory controller 115.

Figure 5:
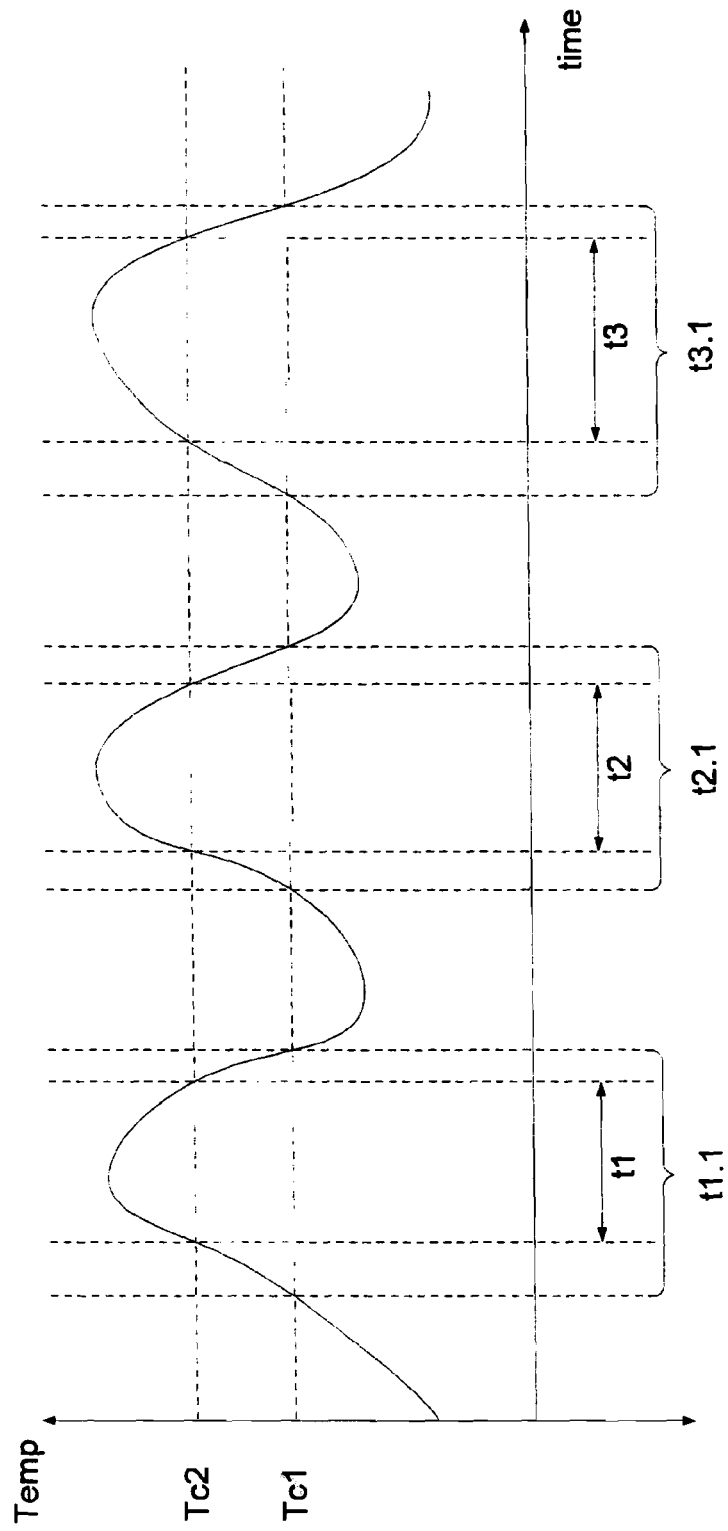
FIG. 5 is a graphical representation of an exemplary temperature of the non-volatile memory over time.

FIG. 5 is a graphical representation of an exemplary temperature of the NVM 110 over time. Referring to FIGS. 2 and 5, the timer 205 tracks the amount of time, t1.1, t2.1, and t3.1, spent above the threshold temperature Tc1. A refresh 220 of at least a portion of the NVM 110 is triggered when the non-volatile counter 215 reaches the threshold period of time within the tracking of t1.1, t2.1, and t3.1.

Referring to FIGS. 3 and 5, the timer 305 tracks the amount of time, t1.1, t2.1, and t3.1, spent above the threshold temperature Tc1. For one embodiment, one or both of the step modules 310 and 320 act to multiply, or otherwise increase, the count of the timer 305 when the temperature exceeds a second threshold temperature Tc2—during times t1, t2, and t3. Alternatively, as discussed above, the step modules 310 and 320 can act to lower the granularity or refresh trigger threshold. FIG. 5 illustrates the example of two threshold temperatures, however, embodiments of the invention may have any number of threshold temperatures to impact the frequency of refresh.

Referring to FIGS. 4 and 5, the shaded regions under the temperature curve represent the integral of the junction temperature. As discussed above, the cumulative value of the integral of the junction temperature may be stored in the NVM 110 and a refresh is triggered when the sum exceeds a threshold value.

Figure 6:
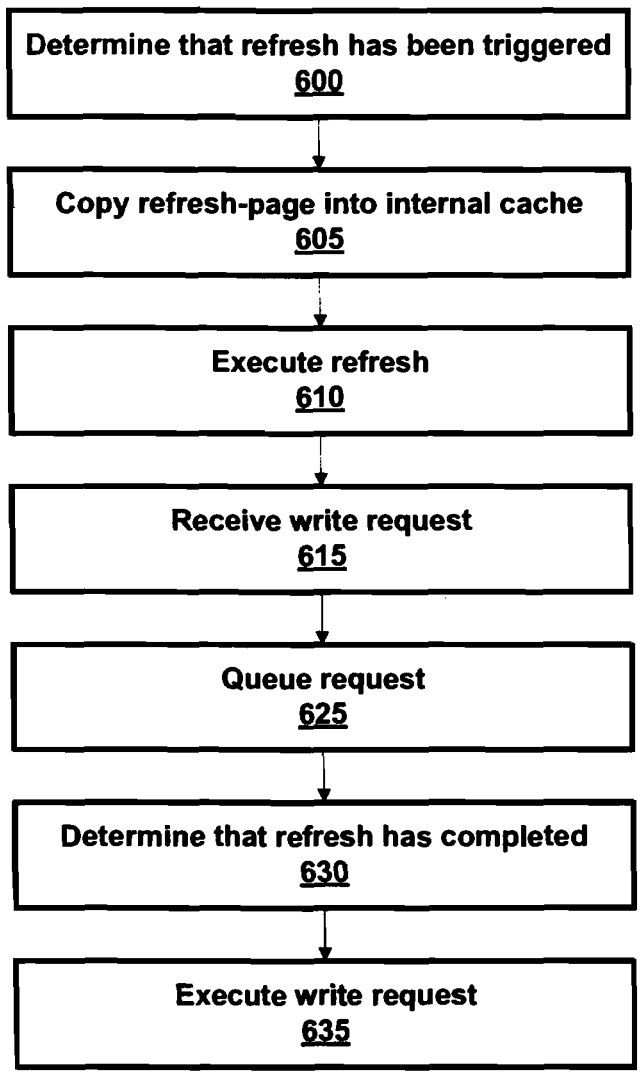
FIG. 6 is a flow chart of a process performed for a write request during a refresh of the non-volatile memory according to an embodiment of the invention.

FIG. 6 is a flow chart of an exemplary process performed for a write request during a refresh of the NVM 110. At block 600, the memory controller 115 determines if a refresh of the NVM 110 has been triggered. At block 605, a copy of a portion of the NVM 110 to undergo a refresh operation is copied into an internal cache to allow for the portion of NVM 110 to be available for a read request during a refresh operation (discussed further below). At block 610, the refresh operation is initiated. For one embodiment, a refresh operation is a program operation comprising a verify operation followed by programming pulses. At block 615, a write request is received during the refresh operation. At block 625, the request is placed in a queue or otherwise stored until the memory refresh has completed. At blocks 630 and 635, it is determined that the refresh has completed and the write request is removed from the queue and executed.

Figure 7:
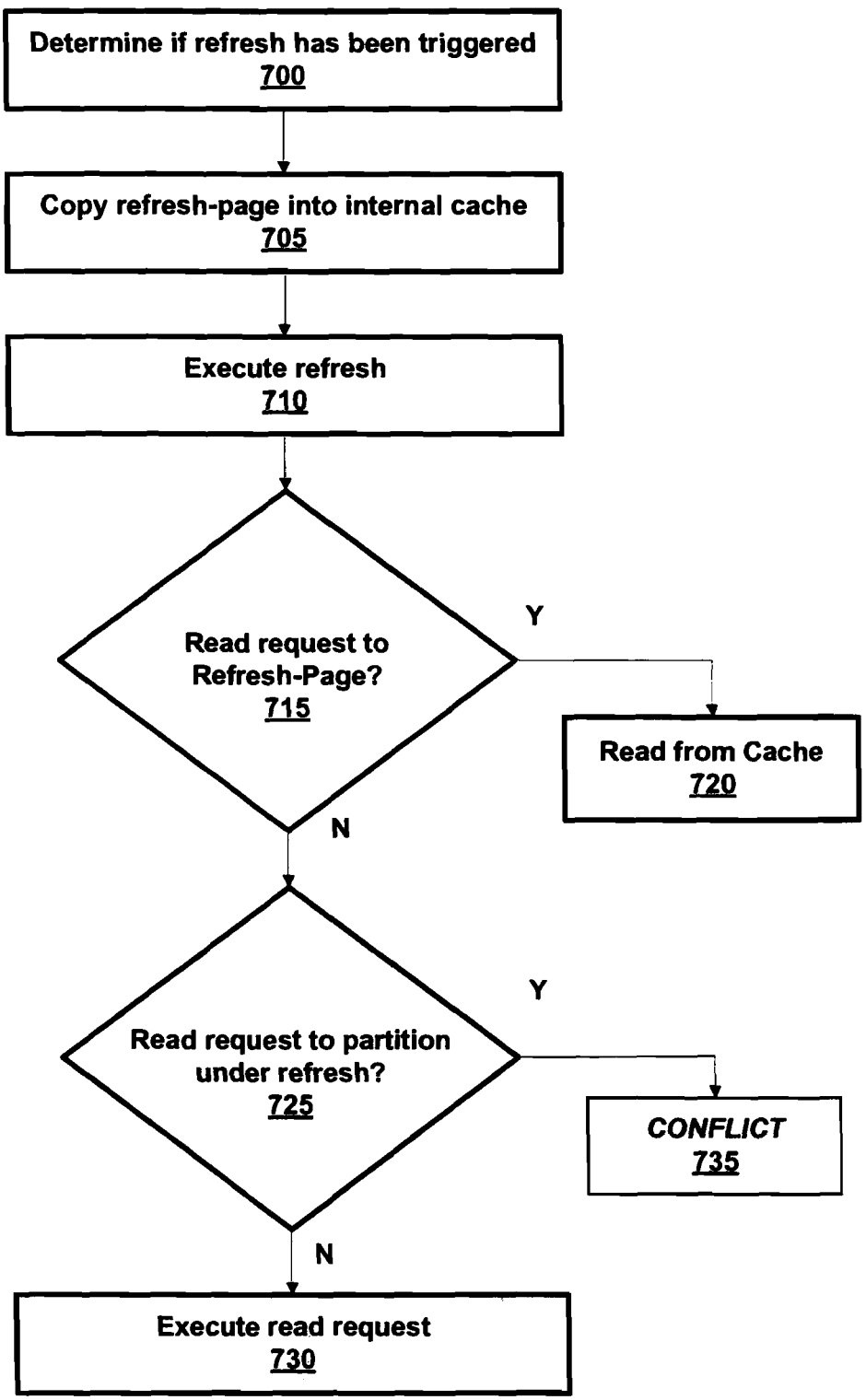
FIG. 7 is a flow chart of a process performed for a read request during a refresh of the non-volatile memory according to an embodiment of the invention.

FIG. 7 is a flow chart of an exemplary process performed for a read request during a refresh of the NVM 110. At block 700, the memory controller 115 determines if a refresh of the NVM 110 has been triggered. At block 705, a copy of a portion of the NVM 110 to undergo a refresh operation is copied into an internal cache. At block 710, the refresh operation is executed. For one embodiment, a refresh is performed with a granularity called a refresh-page.

At block 715, a read request is received and the memory controller 115 determines if the request is directed to the portion of the NVM 110 undergoing a refresh. At block 720, if the read request is directed to the refresh-page, the read request is executed from the cache.

Alternatively, if the read request is not directed to the portion of the NVM 110 undergoing a refresh, the memory controller 115 determines if the request is directed to the same partition as the portion of the NVM 110 undergoing a refresh. For one embodiment, the NVM 110 supports a read-while-write ("RWW") feature used to split the memory into a number of partitions (also referred to as banks), allowing a read operation to be executed on one partition while a modify or write operation is executed in another partition. At block 730, if the read request addresses a different partition from the partition in which the refresh is on-going, the read request is executed according to RWW.

At block 735, if the read request is directed to the same partition as the portion of the NVM 110 undergoing a refresh, the request results in a conflict and the partition cannot be read until the refresh operation is complete (a method for handling a conflict is described below).

Figure 8:
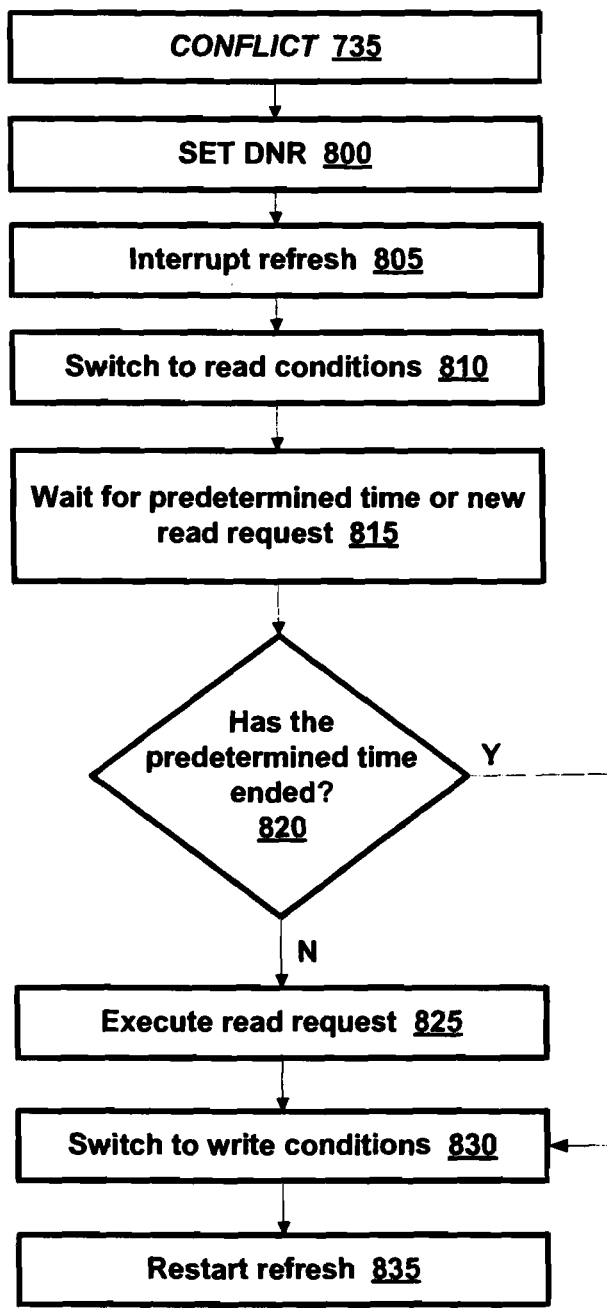
FIG. 8 is a flow chart of a process performed for handling a conflict resulting from a read request occurring during a refresh of the non-volatile memory according to an embodiment of the invention.

FIG. 8 is a flow chart of an exemplary process performed for handling a conflict resulting from a read request during a refresh of the NVM 110. At block 735, as discussed above, a conflict results when a read request is directed to the same partition as the portion of the NVM 110 undergoing a refresh. At block 800, to manage this conflict, a Data-Not-Ready ("DNR") signal is set by the NVM 110 to inform the memory controller 115 that the requested data is not ready to be read and that the read request should be resent. At block 805, the on-going page refresh is interrupted. At block 810, the memory controller 115 switches the partition that was undergoing a refresh to read mode. At block 815, the memory controller 115 waits for the read request to be resent or a new read request to be sent for a predetermined period of time. At block 820, if the read request is not issued prior to the end of the predetermined period of time, the memory controller 115, at blocks 830 and 835, switches the partition to write mode and restarts the refresh.

If the read request is issued during the predetermined period of time, at block 825, the read request is executed. At blocks 830 and 835, the memory controller 115 switches the partition to write mode and restarts the refresh.

FIG. 9 is a table showing exemplary values for a refresh register used to synchronize the NVM 110 refresh with a memory controller 115. The refresh register contains information about the refresh operations. A trigger event bit, RR.0, is set when the NVM 110 is due for a refresh. For one embodiment, the modules of the NVM 110, as described with reference to FIG. 2 or FIG. 3, set the trigger event bit page refresh to synchronized a refresh with the memory controller 115. The page refresh active bit, RR.1, is set to manage read and write requests during a refresh. Furthermore, a refresh-page address may be set in additional bits RR.2-RR.15 to indicate the area of the NVM 110 undergoing a refresh to manage read requests during the refresh. The refresh register of FIG. 9 is exemplary and, in alternate embodiments, may contain more or less bits, contain additional functions, or include the described functions in a different order.

Figure 10:
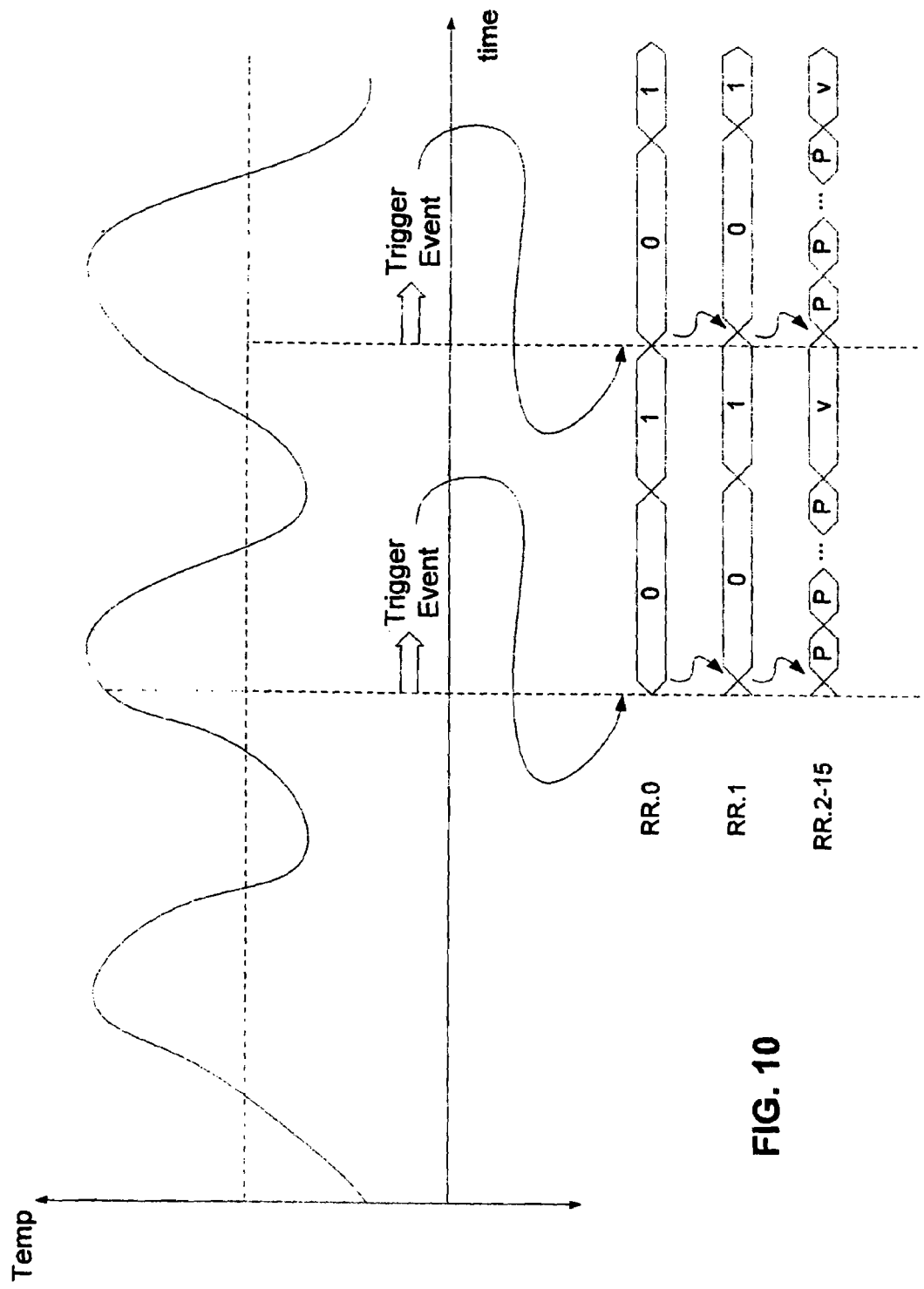
FIG. 10 is a graphical representation of an exemplary temperature of the non-volatile memory over time and corresponding refresh register values according to an embodiment of the invention.

FIG. 10 is a graphical representation of an exemplary temperature of the NVM 110 over time and corresponding refresh register values. For example, with reference to FIGS. 2 and 9, a refresh of at least a portion of the NVM 110 is triggered when the non-volatile counter 215 reaches the threshold period of time. The trigger event sets RR.0 to zero to indicate that the memory controller 115 should execute a refresh. While the refresh is executed, RR.1 is set to indicate that the partition of the NVM 110 is busy and RR.2-15 are set to indicate which pages of the NVM 110 are undergoing a refresh.

The methods described with reference to the flowcharts in FIGS. 6-8 enable one skilled in the art to develop programs, including corresponding instructions to carry out the operations (acts) represented by the logical blocks on suitably configured computers, mobile phones, consumer electronic devices, and memory cards (e.g., a processor or controller executing the instructions from machine-readable storage media). The computer-executable instructions may be written in a computer programming language or may be embodied in firmware logic or in hardware circuitry. The phrase "machine-readable storage medium" includes any type of volatile or non-volatile storage device that is accessible by a processor or controller, which is intended to be different from a machine-readable transmission medium for carrier waves.

In the foregoing specification, the invention has been described with reference to specific exemplary embodiments thereof. It will be evident that various modifications may be made thereto without departing from the broader spirit and scope of the invention. Although, for one embodiment of the invention described, the host device is a personal computer, other embodiments of the invention may implement mobile phones, personal digital assistants, digital audio/video players, digital cameras, game consoles, etc. for the host device. The specification and drawings are, accordingly, to be regarded in an illustrative sense rather than a restrictive sense.

What is claimed is:

1. An apparatus comprising:
   a temperature sensor within a non-volatile memory to measure a temperature within the non-volatile memory;
   a first counter to store a first level of granularity of time the non-volatile memory operates at a temperature above a threshold temperature, the first level of granularity of time the non-volatile memory operates at a temperature above the threshold temperature to be stored in a volatile memory;
   a second counter to store a second level of granularity of time the non-volatile memory operates at a temperature above the threshold temperature, the second counter to be incremented by the first counter each time the first counter reaches a unit of the second level of granularity, the second level of granularity of time the non-volatile memory operates at a temperature above the threshold temperature to be stored within the non-volatile memory; and
   a controller to refresh at least a portion of the non-volatile memory when the temperature exceeds a threshold temperature for a period of time.

2. The apparatus of claim 1, wherein the second level of granularity of time is a multiple of the first level of granularity of time.

3. The apparatus of claim 1,
   wherein the controller is to refresh at least the portion of the non-volatile memory when triggered by the second level of granularity reaching a maximum count.

4. The apparatus of claim 3, further comprising a register within the non-volatile memory to store a trigger event value when the second level of granularity reaches the second maximum count and the controller is further to refresh at least a portion of the non-volatile memory when the trigger event value is determined to be set to trigger a refresh.

5. The apparatus of claim 1, wherein a rate at which the controller refreshes at least a portion of the non-volatile memory is to increase corresponding to an increase in temperature beyond the threshold temperature.

6. The apparatus of claim 1, further comprising a cache, wherein the controller is further to copy the portion of the non-volatile memory to the cache and to redirect a read request for the portion of the non-volatile memory to the cache during the refresh.

7. The apparatus of claim 1, wherein the controller is further to receive a read request during the refresh, to interrupt the refresh until the read request is complete, and to resume the refresh.

8. The apparatus of claim 1, wherein the controller is further to receive a write request during the refresh and to put the write request in a queue until the refresh is complete.

9. The apparatus of claim 1, wherein the non-volatile memory includes a register to store a value to indicate whether or not the controller is currently refreshing the non-volatile memory.

10. The apparatus of claim 1, wherein the non-volatile memory includes a register to store a value to indicate which portion of the non-volatile memory is currently being refreshed.

11. An apparatus comprising:
    a temperature sensor within a non-volatile memory to measure an instant temperature within the non-volatile memory;
    a timer to track an amount of time the instant temperature exceeded a threshold temperature;
    a trigger logic to calculate a mathematical integral of the instant temperature by cumulatively combining a series of instantaneous temperatures measured by the temperature sensor with the amount of time each of the series of instantaneous temperatures exceeded the threshold temperature as measured by the timer, the mathematical integral corresponding to the area of a temperature versus time curve for the amount of time the threshold temperature is exceeded, a value of the calculated mathematical integral to be stored in the non-volatile memory and summed with a previous value of a previously calculated integral to produce a total value; and
    a controller to refresh at least a portion of the non-volatile memory when the total value of the calculated mathematical integral exceeds an integral threshold value.

12. A method comprising:
    measuring a temperature within a non-volatile memory;
    storing a value of a first level of granularity of time the non-volatile memory operates at a temperature above the threshold temperature in a volatile memory;
    incrementing a value of a second level of granularity of time the non-volatile memory operates at a temperature above the threshold temperature each time the value of the first level of granularity reaches a unit of the second level of granularity;

storing the value of the second level of granularity in the non-volatile memory; and refreshing at least a portion of the non-volatile memory when the temperature exceeds a threshold temperature for a period of time as determined by at least the value of the second level of granularity.

13. The method of claim 12, wherein the second level of granularity is a multiple of the first level of granularity.

14. The method of claim 12, wherein the value of the first level of granularity is incremented periodically during a time period the temperature exceeds the threshold temperature, the value of the second level of granularity is incremented each time the first level of granularity reaches a first maximum count, and at least the portion of the non-volatile memory is refreshed when the value of the second level of granularity reaches a second maximum count.

15. The method of claim 12, further comprising determining that the value of the second level of granularity is set to trigger a refresh, wherein the refreshing of the at least the portion of the non-volatile memory is initiated in response to the determination.

16. The method of claim 12, wherein a rate at which the controller refreshes the at least the portion of the non-volatile memory increases corresponding to an increase in temperature beyond the threshold temperature.

17. The method of claim 12, further comprising:

copying the portion of the non-volatile memory to a cache;

receiving a read request for the portion of the non-volatile memory during the refresh; and redirecting the read request to the cache.

18. The method of claim 12, further comprising:

receiving a read request during the refresh;

interrupting the refresh until the read request is complete; and resuming the refresh.

19. The method of claim 12, further comprising:

receiving a write request during the refresh;

placing the write request in a queue; and executing one or more write requests from the queue once the refresh is complete.

20. The method of claim 12, further comprising storing a value to indicate whether or not the controller is currently refreshing the non-volatile memory.

21. The method of claim 12, further comprising storing a value to indicate which portion of the non-volatile memory is currently being refreshed.

22. A method comprising:

measuring an instant temperature within a non-volatile memory;

tracking an amount of time the instant temperature exceeds the threshold temperature;

calculating a mathematical integral of the instant temperature by cumulatively combining a series of instantaneous temperatures measured by the temperature sensor with the amount of time each of the series of instantaneous temperatures exceeds the threshold temperature, the mathematical integral corresponding to the area of a temperature versus time curve for the amount of time the threshold temperature is exceeded, a value of the calculated mathematical integral to be stored in the non-volatile memory and summed with a previous value of a previously calculated integral to produce a total value; and refreshing at least a portion of the non-volatile memory when the total value of the calculated mathematical integral exceeds an integral threshold value.

* * * * *

UNITED STATES PATENT AND TRADEMARK OFFICE
CERTIFICATE OF CORRECTION

PATENT NO. : 8,572,333 B2  
APPLICATION NO. : 12/532828  
DATED : October 29, 2013  
INVENTOR(S) : Emanuele Confalonieri et al.

Page 1 of 1

It is certified that error appears in the above-identified patent and that said Letters Patent is hereby corrected as shown below:

Title page, in item (74), under "Name of the Attorney, Agent or Firm", in column 2, line 1, delete "Schwegman" and insert -- Schwegman, --, therefor.

In the Claims:

In column 10, line 35, in Claim 22, delete "exceeds" and insert -- of the instant temperature exceeds --, therefor.

Signed and Sealed this
Twenty-eighth Day of January, 2014

Michelle K. Lee
*Deputy Director of the United States Patent and Trademark Office*